United States Patent [19]

Routh

[11] 4,105,941
[45] Aug. 8, 1978

[54] DRIVER FOR REACTIVE LOAD

[75] Inventor: Claude C. Routh, San Diego, Calif.

[73] Assignee: The United States of America as represented by the Secretary of the Navy, Washington, D.C.

[21] Appl. No.: 823,792

[22] Filed: Aug. 11, 1977

[51] Int. Cl.[2] .............................................. H03F 3/68
[52] U.S. Cl. .............................. 330/124 R; 330/167; 330/295; 330/304; 330/306
[58] Field of Search ................... 330/124 R, 165, 167, 330/276, 295, 302, 304, 306

[56] References Cited

U.S. PATENT DOCUMENTS 3,406,352  10/1968  Gardenghi .................. 330/124 R X
3,703,685  11/1972  Simopoulos et al. ............ 330/295 X

OTHER PUBLICATIONS

"4-Channel Audio Mixer," Radio-Electronics vol. 42, No. 7, Jul. 1971.

Primary Examiner—James B. Mullins
Attorney, Agent, or Firm—Richard S. Sciascia; Ervin F. Johnston; John Stan

[57] ABSTRACT

An apparatus for driving a reactive load, comprises a plurality of N multi-input elements N ≧ 2, connected in parallel, capable of amplifying a band of frequencies. Two inputs of each element can be connected to sources of direct-current voltage. Each circuit element and elements connected to its inputs define a circuit stage. N means, each means connected to at least one of the inputs of the circuit elements, are capable of equalizing the gain of each of the N stages within a prescribed percentage. A transformer having N primary, input, windings and one secondary output, winding, is connectable to the load. Each of the N primary windings have their inputs connected to one of the inputs of the circuit elements. The transformer is so designed that its impedance, usually inductive, as seen from the load, balances the capacitive load, to be connected to it, over the bandpass of interest.

7 Claims, 3 Drawing Figures

APPARATUS FOR DRIVING A REACTIVE LOAD.

FIG. 1. APPARATUS FOR DRIVING A REACTIVE LOAD.

COMPLEX IMPEDANCE OF A TRANSDUCER ASSEMBLY, SERIES MEASUREMENT, AND MATCHING INDUCTANCE $X_L$.

TEST SETUP FOR MEASURING IMPEDANCE OF MATCHING NETWORK AND TRANSDUCER.

DRIVER FOR REACTIVE LOAD

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention arose from the need to develop a power amplifier capable of driving a reactive transducer broadband with up to 600 volt-amperes, which had to be small enough to fit into a 5-inch cylinder. It also had to be lightweight.

In the prior art, power amplifiers to drive transducers at this level are usually large and heavy. They normally require resonating inductors that are also heavy.

600 volt-amperes were required out of the driver. No one transistor was adequate. A hybrid circuit that had short and open circuit protection is used. The transistors reduced out-put with heat and this means they must be derated for reactive loads. For the load required, eight in parallel were used.

No technique was available for paralleling so many units, usefully. A technique devised and believed novel was to have each transistor drive the primary of a transformer. The power addition thus takes place magnetically, in the transformer.

SUMMARY OF THE INVENTION

The invention relates to a compact, lightweight, power amplifier or driver capable of driving a reactive transducer broadband with up to 600 volt-amperes. It comprises a high-pass filter, at whose input is applied the broadband input signal, in series with a low-pass (LP) filter. The output of the LP filters drives the input of either power transistors connected in parallel, each transistor at its output driving one of eight separate primaries of an output transformer. The low-voltage end of each primary winding has a resistor to ground, to equalize the loads on each winding. The one secondary winding drives an output transducer. The amplifier is so designed as to provide the least phase angle over the frequency band of interest.

STATEMENT OF THE OBJECTS OF THE INVENTION

An object of the invention is to provide an electronic apparatus for driving a transducer load requiring many volt-amperes.

Another object of the invention is to provide an apparatus which can drive the load with up to 600 volt-amperes and yet be lightweight.

Yet another object of the invention is to provide a driving apparatus which does not require heavy resonating inductors.

These and other objects of the invention will become more readily apparent from the ensuing description when taken together with the drawings.

DESCRIPTION OF THE PREFERRED EMBODIMENTS

Figure 1:
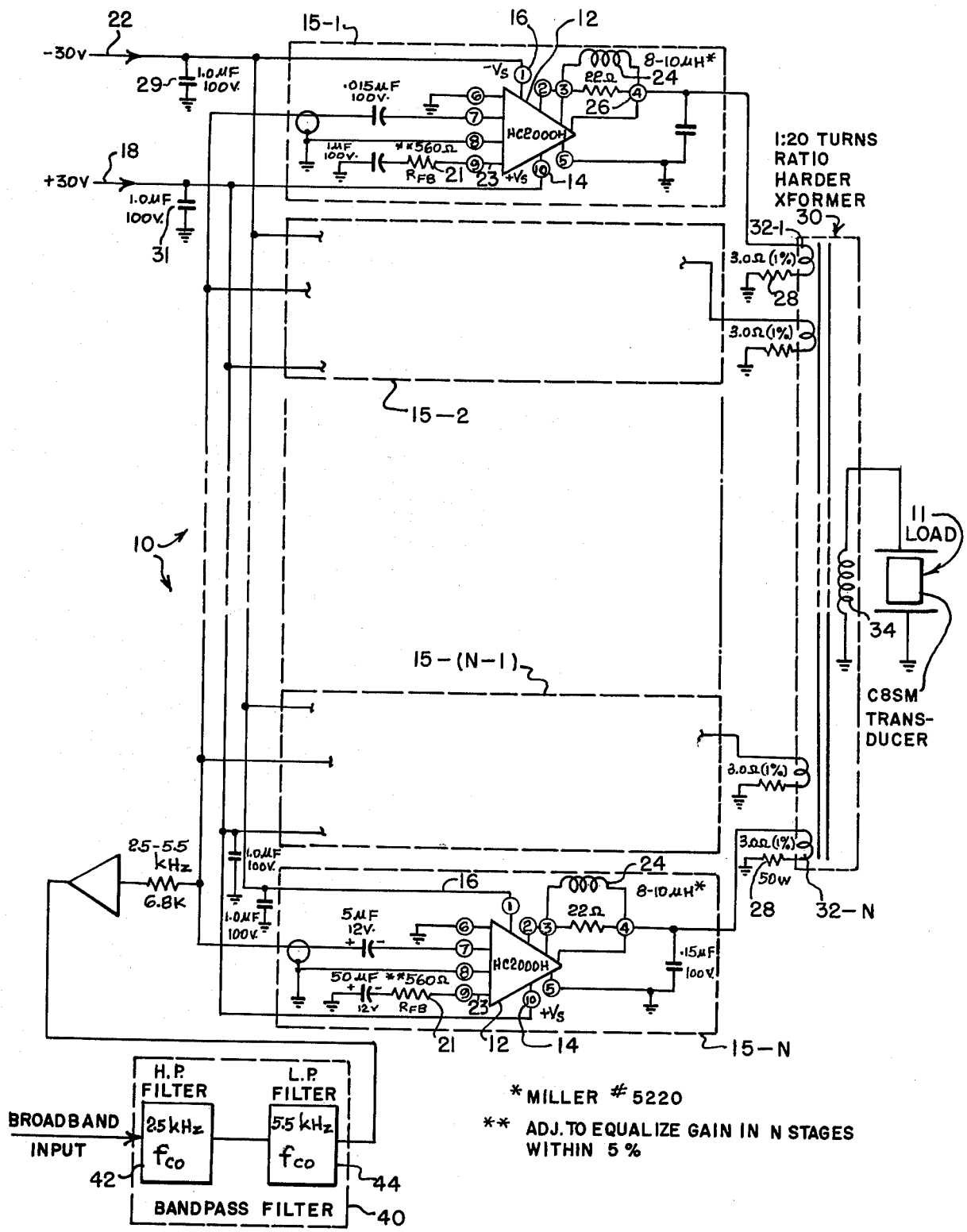
FIG. 1 is a block and circuit diagram of the apparatus of the invention for driving a reactive load, in this case, a transducer, as shown.

Referring now to FIG. 1, therein is shown an apparatus 10 for driving a reactive load 11, comprising a plurality of N multi-input circuit elements 12, N $\geq$ 2, connected in parallel, capable of amplifting a band of frequencies. Two inputs, 14 and 16, of each element 12 are connectable to sources, 18 and 22, of direct-current voltage, $+V_s$ and $-V_s$. Each circuit element 12 and elements connected to its inputs define a circuit stage, the N stages being labeled 15-1 through 15-N, and shown by dashed lines.

N means 21, each means connected to at least one of the inputs 23 of the circuit elements, have parameters such as to be capable of equalizing the gain of each of the N stages within a prescribed percentage. In a specified embodiment actually built, the required amount was within 5%.

N means 24, each capable of preventing high frequency oscillation, are connected across two of the terminals of the circuit elements 12.

A transformer 30, having N primary, input, windings, 32-1 through 32-N, and one secondary, output, winding 34, is connectable to the load 11. Each of the N primary windings 32 have their inputs connected to one of the outputs 26 of the circuit elements 12. The transformer actually used was the Model 97025, manufactured by Donald C. Harder Co., 2580 K Street, San Diego, California 92102, the inductance of which can be varied by gapping, to fine tune it to the load.

The primaries 32 have equal turns and so the voltage developed across each primary tends to be equal. The stages 15 have a common drive, and if the gain of each amplifier 12 if different, it would try to establish different voltages on each primary 32. This conflict in power dissipation (partially) is avoided by adding a small resistor 28 in series with each primary. This helps also to reduce the reactiveness of the load 11 and helps compensate for the power loss. Any difference in voltage at each unit's output is dropped across each primary 32.

Figure 2:
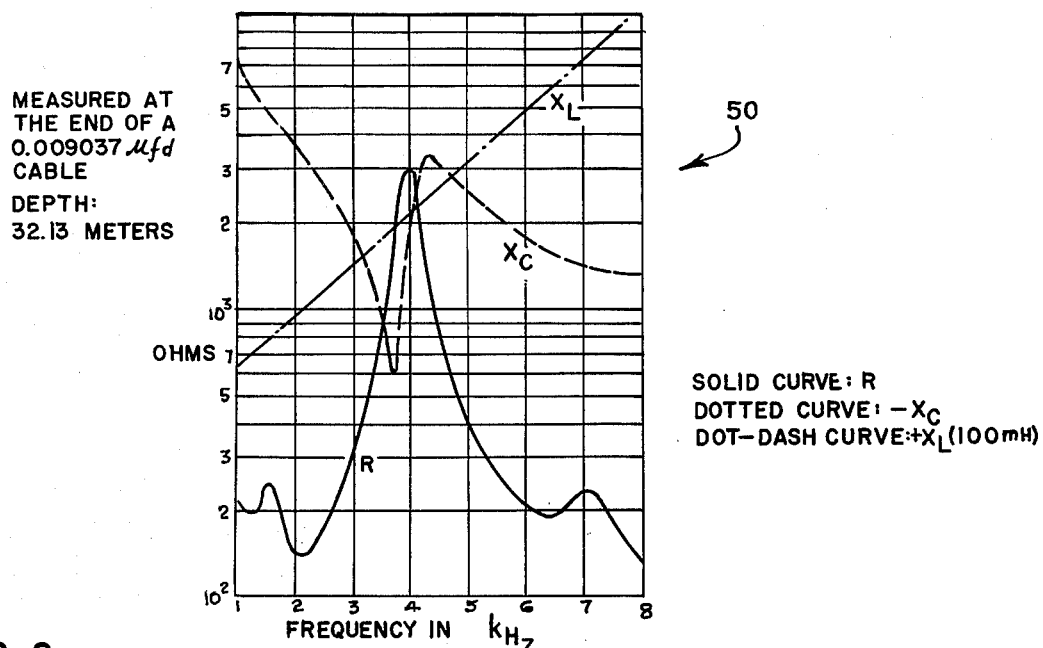
FIG. 2 is a set of charts showing the complex impedance of the transducer load and the inductive reactance of the matching transformer.

The transformer 30 is so designed that its impedance, almost always inductive, as seen from the load 11, balances a capacitive load to be connected to it, over the bandpass of interest. FIGS. 1 and 2 show a bandpass of approximately [(5.5 − 2.5) kHz = ]3 kHz, but the teachings of the invention were used to obtain a pass band of 12.5 kHz, using the transducer 11 shown.

The apparatus 10 shown in FIG. 1 may further comprise a plurality of N resistors 28, each connected in series with a primary coil 32, so that if a coil, or a component in series with it, becomes shorted, current through that coil is limited to a safe level, thereby permitting further use of the apparatus 10.

The series resistor 28 in each primary circuit prevents in effect, a shorted turn on the primary 32 as well as too great a loading of the other stages 15, if the output of one or even two or three of the stages becomes a short due to its output transistor's 12 failing. If this happens, the primary 32 had the resistor 28 across it as a load, which is large but not sufficient to reduce the other stages' output significantly. This is a provision which was included so that a weak link cannot cause total failure.

To meet the rigorous size and weight requirements, the transformer 30 was uniquely designed to be reactive (inductive) the current amount to resonate with the transducer 11, and offer in combination with it a load for the driver amplifier 10 with the least phase angle over the frequency band. The normally designed transformer serves to reflect a load to its primary and does not change the load's phase angle seen by the driver significantly. This invention saves weight and volume since normally an inductor is added to the transducer 11 to resonate with it and reduce the phase angle of the combination as a load.

In an apparatus 10 actually built, the circuit elements were transistors 12, type No. HC 2000H, manufactured by RCA Solid State, Box 3200, Somerville, New Jersey 08876.

To eliminate the possibility of the transistor oscillating, for example, due to long leads, additional filtering is provided by capacitors 29 and 31.

The apparatus 10 may further comprise a band-pass filter 40, connected in series with the N parallel circuit stages. The bandpass filter 40 would generally comprise a high-pass filter 42 in series with a low-pass filter 44.

The apparatus 10 may further comprise the load 11 itself, for example, a transducer, connected to the output winding 34 of the transformer 30.

In the apparatus 10 the gain equalizing circuit may comprise a resistor 21. A specific choke 24 which has been used to successfully prevent high frequency oscillation is an 8–10 mh choke manufactured by Bell Industries, the J. W. Miller Division, Department EM, 19070 Reyes Avenue, Compton, California 90221.

With respect to impedance matching of the load 11, networks can be designed around the impedance information on a transducer by calculating the total impedance which the matching network impedance is added. This is rather inaccurate and time consuming. FIG. 2 illustrates typical results. The R curve designates a "complex" resistance, that is, one which varies with frequency.

Figure 3:
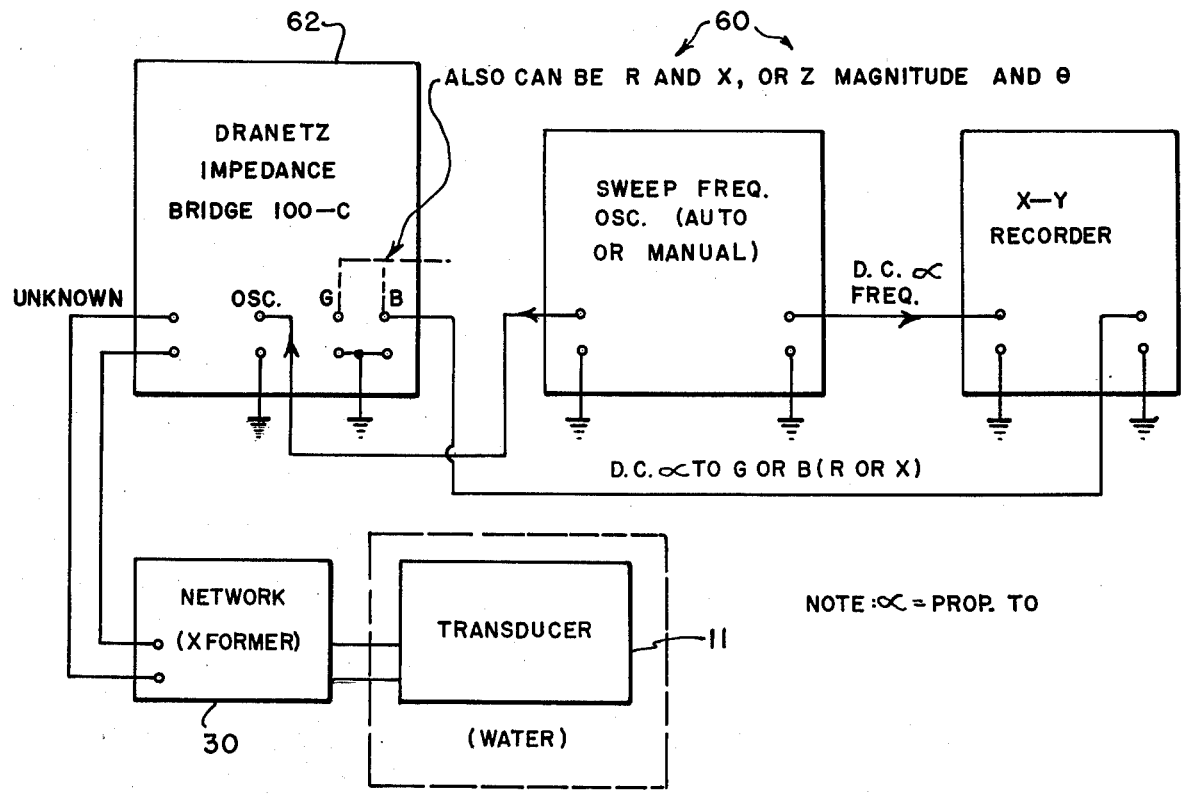
FIG. 3 is a block diagram of a prior art test set-up for measuring the impedance of the matching network and the transducer load.

One can use decade standard passive elements to form the network, connect it to the transducer 11 in water, and measure the total load impedance with an impedance bridge. Referring to FIG. 3, when the results are graphed on an X-Y plotter 62, continuous instead of spot frequency information can be obtained. These results then can be used to indicate the next approximation for best match.

FIG. 3 shows a suitable prior art instrumentation setup 60 for designing matching networks. B ($=1/X$) vs frequency and then G ($=1/R$) vs frequency plots are made of the transducer 11. As had been shown, this can be used to design the matching network.

After a network is designed the current requirements vs frequency can be measured if desired, using the Dranetz 100C Model, reference No. 62, by taking the vector magnitude of the complex impedance of the whole load. Since I = (E/Z) the voltage used must be divided by this magnitude. The phase angle vs frequency can also be taken with the Dranetz 100-C bridge 62.

Also, one can measure these items roughly on am impedance bridge, if an R vs X "circle" plot is made, and lines drawn representing the limit of the phase angle $\theta$ (tan $\theta = (X/R)$), positive and negative, one wishes to tolerate. The circle must remain inside the limits of the two lines.

Obviously, many modifications and variations of the present invention are possible in the light of the above teachings, and, it is therefore understood that the invention may be practiced otherwise than as specifically described.

What is claimed is:

1. Apparatus for driving a reactive load, comprising:
   a plurality of N multi-input circuit elements, $N \geq 2$, connected in parallel, capable of amplifying a band of frequencies, two inputs of each element being connectable to sources of direct-current voltage, each circuit element and elements connected to its inputs defining a circuit stage;
   N means, each means connected to at least one of the inputs of the circuit elements, capable of equalizing the gain of each of the N stages within a prescribed percentage;
   a transformer having N primary, intput, windings and one secondary, output, winding, which is connectable to the load, each of the N primary windings having their inputs connected to one of the outputs of the circuit elements;
   the transformer being so designed that its impedance, whether capacitive or inductive, as seen from the load, balances the inductive or capacitive load, respectively to be connected to it, over the band pass of interest.

2. The apparatus according to claim 1, further comprising:
   a plurality of N resistors, each connected in series with a primary coil, so that if a coil, or a component in series with it, becomes shorted, current through that coil is limited.

3. The apparatus according to claim 2, wherein:
   the circuit elements are transistors.

4. The apparatus according to claim 3, further comprising:
   a bandpass filter, connected in series with the N circuit stages.

5. The apparatus according to claim 4, wherein:
   the bandpass filter comprises a high-pass filter in series with a low-pass filter.

6. The apparatus according to claim 5, further comprising:
   a transducer, connected to the output winding of the transformer.

7. The apparatus according to claim 6, wherein:
   the gain equalizing circuit comprises a feedback resistor.

* * * * *